United States Patent [19]
Shinji

[11] Patent Number: 5,844,264
[45] Date of Patent: *Dec. 1, 1998

[54] CHARGE-COUPLED DEVICE IMAGE SENSOR

[75] Inventor: Uya Shinji, Kwacheon-si, Rep. of Korea

[73] Assignee: LG Semicon Co., Ltd., Chungcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 530,676

[22] Filed: Sep. 19, 1995

[51] Int. Cl.$^6$ .................. H01L 27/148; H01L 29/768; H01L 31/113; H01L 31/0232
[52] U.S. Cl. .................. 257/223; 257/231; 257/233; 257/291; 257/297; 257/432; 257/435
[58] Field of Search ................. 257/222, 223, 257/229, 231, 232, 233, 432, 435, 297, 291

[56] References Cited

U.S. PATENT DOCUMENTS

| | | | |
|---|---|---|---|
| 4,074,302 | 2/1978 | Brewer | 357/24 |
| 4,484,210 | 11/1984 | Shiraki et al. | 357/24 |
| 4,589,027 | 5/1986 | Nakamura et al. | 257/291 |
| 4,696,021 | 9/1987 | Kawahara et al. | 257/229 |
| 4,914,493 | 4/1990 | Shiromizu | 257/223 |
| 4,984,045 | 1/1991 | Matsunaga | 357/24 |
| 5,343,060 | 8/1994 | Abe | 257/435 |
| 5,471,246 | 11/1995 | Nishima et al. | 257/231 |
| 5,614,740 | 3/1997 | Gardner et al. | 257/222 |

OTHER PUBLICATIONS

Shinji Oosawa, et al., An Electron Counting Detector for CCD Image Sensors, Extended Abstracts of the 20th (1988 International) Conference on Solid State Devices and Materials, pp. 355–358, 1988.

N.S. Saks, A Technique for Suppressing Dark Current Generated by Interface States in Buried Channel CCD Imagers, IEEE Electron Device Letters, vol. EDL–1, pp. 131–133, 1980.

Jan T. Bosiers, et al., FT–CCD for Consumer Applications with Low Dark Current by Surface Pinning, Philips Journal of Research, vol., 48, No. 3, pp. 159–184, 1994.

Teranishi et al "No Image Lag Photodiode Structure in the Interline CCD Image Sensor" International Electron Devices Meeting (Dec. 1982), Technical Digest, pp. 324–327.

Matsunaga et al "A High Sensitivity Amplifier for Image Sensor" International Electron Devices Meeting (Dec. 1987), Technical Digest, pp. 116–119.

*Primary Examiner*—Gene M. Munson
*Attorney, Agent, or Firm*—Morgan, Lewis & Bockius LLP

[57] ABSTRACT

A charge-coupled device image sensor includes a substrate, a buried channel region of a first conductivity type, formed in the substrate to a predetermined depth, for transferring signal charges, a first high concentration impurity region of a second conductivity type, formed in the substrate adjacent to the buried channel region, forming a channel stop, a first surface channel region of the second conductivity type, formed on the buried channel region, for transferring dark current charges, a second high concentration impurity region of the first conductivity type, formed on the first high concentration impurity region, for removing dark current charges from the surface channel region, and a second surface channel region of the second conductivity type formed to a predetermined depth in the substrate between the second high concentration impurity region and the first surface channel region.

21 Claims, 14 Drawing Sheets

CHARGE-COUPLED DEVICE IMAGE SENSOR

BACKGROUND OF THE INVENTION

1. Field of the Invention

The present invention relates to a charge-coupled device (CCD) image sensor, and more particularly, a CCD image sensor which reduces dark currents and micro white defects.

2. Discussion of the Related Art

There are several factors which impede efforts to improve sensitivity and to miniaturize a CCD image sensor. Important problems include micro white defect and dark current.

The micro white defect becomes relevant at the high temperature test of 60° C. because this defect output is generally doubled with respect to a 10° C. temperature rise. The dark time output of each pixel is also dispersed. The pixel having an output which is out of a gentle slope curve of such output distribution is one having the micro white defect. The micro white defect is rarely found at room temperature except in the dark time which is somewhat higher than that of general pixel.

A significant cause of the micro white defect is a generation recombination center (GRC) which results from heavy metal contamination. If one GRC exists in a pixel, one can expect that the GRC will cause the micro white defect.

In general, if a charge defect sensitivity is 16 $\mu V/e^{31}$ at a temperature of 60° C., such a defect has an output of about 3 to 4 mV. At this time, the output of the dark current and micro white defect represents a value in a CCD image sensor of an interline transfer method using a photodiode of pin structure.

Meanwhile, the dark current is defined as the mean value of the outputs of whole pixels. Since the values of the dark current is dispersed by each pixel, a histogram of the dark current nearly has a Gaussian distribution (*Phillips Journal of Research*, Vol.48, No.3, 1994, pp.159–184, FIG. 22). In the distribution of the dark current, the portion having a gentle slope exists in the vicinity of 1mV from the center of the dark current distribution. This portion is changed according to the contamination state of each manufacturing line.

If the output voltage is increased with the sensitivity of the charge detection circuit of the CCD image sensor in order to solve the aforementioned problem, the micro white defect occurs. Even if the micro white defect is removed, a pixel having a large dark current is observed as having the micro white defect if the dispersion of the dark current is not reduced. Furthermore, the micro white defect increases exponentially with sensitivity.

In addition, the absolute value and the dispersion of the dark current become an issue. Short noise results when the signal charge is detected at high sensitivity, even with uniform dark current.

The sensitivity of a charge detection circuit of the CCD image sensor can be improved significantly as shown in U.S. Pat. Nos. 4,074,302 or 4,984,045, for example. Further, the number of equivalent noise electrons accompanied when detecting the charge can be reduced to $1e^{31}$ or less (*IEDM Tech. Dig.*, pp.116–119, 1987, and *Extended Abstracts of 20th International Conference on Solid State Device and Materials*, pp.355–358).

However, if the signal charge is detected with high sensitivity as described above, the micro white defect affects the entire picture. In addition, the short noise is remarkably visible. As a result, high sensitivity signal charge detection in a CCD image sensor is not currently practical.

FIG. 1 is a block diagram of a CCD image sensor that operates according to a general frame transfer method. Referring to FIG. 1, the CCD image sensor that operates according to the general frame transfer method comprises a sensor area 11, a storage area 12, a horizontal charge-coupled device (HCCD), and a signal charge detection and amplification circuit 14.

With respect to general incident light, sensor area 11 generates signal charges and accumulates the generated signal charges for a given time. The signal charges accumulated in sensor area 11 are transferred at one time to storage area 12 during a vertical erase period. The signal charges accumulated in storage area 12 are extracted line-by-line until the following vertical erase period and, thus, transferred to HCCD 13. If the signal charges accumulated in storage area 12 are extracted, all the signal charges which are generated and accumulated in the sensor area 11 move again to the accumulation region and, thus, the above process is repeated. The signal charges of storage area 12 are detected through the signal charge detection and amplification circuit 14 and, thus, are signal-treated.

FIG. 2 is a cross-sectional view showing the structure of the sensor area 11 in the CCD image sensor that operates according to the frame transfer method of FIG. 1. In the sensor area 11 of the CCD image sensor according to the general frame transfer method, a $p^{31}$ type well 112 is formed in an $n^{31}$ type substrate 111. An n type buried channel region 113 is formed in $p^{31}$ type well 112, and $p^{30}$ type channel stop regions 114 are formed on both sides of n type buried channel region 113. Further, an insulating film 115 consisting of $SiO_2$ is formed on substrate 111 and a transfer electrode 116 consisting of polysilicon film is formed on insulating film 115. An insulating layer 117 is formed as a protection film on transfer electrode 116.

If the number of electrons generated in n type buried channel region 113 exceed a predetermined number, sensor area 11 of the above structure has a vertical overflow drain structure in which the excessive electrons are withdrawn through substrate 111.

In sensor area 11 having the aforementioned structure, signal charges, i.e., electrons, are generated in n type buried channel region 113 by the incident light through transfer electrode 116 and, thus, integrated. At the same time, electrons generated in the interface between insulating film 115 and substrate 111, i.e., the $SiO_2/Si$ interface, or $p^{31}$ type well 112 are accumulated in n type buried channel region 113. Thus, the dark current flows through the CCD image sensor even if no input light exists.

However, as shown in FIG. 2, if the sensor area has a vertical overflow drain structure, the dark current caused by the electrons generated in $p^-$ type well 112 is negligible since $p^-$ type well 112 is very shallow and the GRC hardly exists therein.

However, the electrons generated in the interface state of the $SiO_2/Si$ interface, which is a depletion state, greatly affect the dark current. That is, in sensor area 11 of FIG. 2, the $SiO_2/Si$ interface is almost in a depletion state. Most of the electrons generated in the interface state are accumulated in n type buried channel region 113 of sensor area 11.

Therefore, in the CCD image sensor of the general frame transfer method, since storage area 12 and HCCD 13 have structures similar to sensor area 11, a large dark current flows as a result of the electrons generated in the $SiO_2/Si$ interface of the entire CCD image sensor. Furthermore, the grains of the $SiO_2/Si$ interface are not aligned with each other but are dislocated locally so that the heavy metals precipitate easily. Thus, most micro white defects exist in the $SiO_2/Si$ interface.

FIG. 3 is a block diagram of a CCD image sensor according to a general interline transfer method. A CCD image sensor according to the general interline transfer method comprises a pixel area 31 consisting of photodiode and VCCD, an HCCD 32, and a signal charge detection and amplification circuit 33. As shown in FIG. 3, the CCD image sensor of the general interline transfer method does not include a storage area like the CCD image sensor of the general frame transfer method of FIG. 1.

FIG. 4 is a cross-sectional view showing the structure of one pixel cell in the CCD image sensor that operates according to the interline transfer method of FIG. 3. A $p^-$ type well 312 is formed in an $n^-$ type substrate 311. In $p^-$ type well 312, an n type photodiode 313 and an n type VCCD 315 are spaced apart from each other. A $p^+$ type hole accumulation layer 314 is formed on the surface of n type photodiode 313. The neighboring n type photodiode 313 and n type VCCD 315 are isolated from each other through the $p^+$ type channel stop region 316. A gate insulating film 317 is formed on substrate 311. On gate insulating film 317 excluding the portion above photodiode 313, a transfer electrode 318 consisting of polysilicon film, an insulating film 319, and a light-shielding film 320 are formed sequentially. A planarizing layer 321 is formed on gate insulating film 317 and light-shielding film 320. A microlens 322 is formed on planarizing layer 321 corresponding to photodiode 313.

In the above CCD image sensor of the general interline transfer method, the dark current of photodiode 313 is remarkably reduced because the $p^+$ type hole accumulation layer 314 is formed in the surface of photodiode 313 which functions similarly as that of the sensor region of the CCD image sensor of the frame transfer method.

However, since the VCCD and HCCD of the above CCD image sensor of the general interline transfer method has the same structure as that of the CCD image sensor of the general frame transfer method, the dark current caused by the electrons generated in the $SiO_2/Si$ interface will still exist in the CCD image sensor of the general interline transfer method.

As described above, since the dark current and the micro white defect are generated mainly in the $SiO_2/Si$ interface, preventing the electrons generated in the interface from being mixed into the signal charge is important.

Some conventional methods which are currently used include an "All Gate Pinning Technique" (*IEEE Electron Device Lett.* 1(7), pp.131–133, 1980 or *Phillips Journal of Research*, Vol.48, No.3, pp.159–184, 1994), and a "Surface Pinned Photodiode of Interline Transfer CCD" (*IEDM'82, Digest*, pp.324–327, 1982 or U.S. Pat. No. 4,484,210).

However, the surface pinned photodiode of an interline transfer CCD uses a $p^+$ type hole accumulation layer which is formed below the $SiO_2/Si$ interface, thereby suppressing the generation of electrons in the surface of the n type photodiode and the diffusion thereof. Using this technique, the dark current generated in the photodiode can be reduced to one-tenth. However, in this technique, the dispersion of the dark current is large. In addition, the charge electrons are generated in the $SiO_2/Si$ interface of the VCCD and HCCD, and thus, mixed into the signal charge.

Further, in the former technique, since the "pinning" state cannot be maintained during the charge transfer operation, electrons generated in the $SiO_2/Si$ interface of the VCCD and HCCD are mixed with the electrons into the signal charge.

FIG. 5 is a cross-sectional view showing the structure of the sensor area of the CCD image sensor of another conventional frame transfer method. This CCD image sensor has a structure for preventing the electrons generated in the $SiO_2/Si$ interface from mixing into the signal charge.

In the cross-sectional structure of the sensor area of the CCD image sensor according to the frame transfer method of FIG. 5, a p type surface channel region 518 is stacked on an n type buried channel region 513 unlike the cross-sectional structure of the sensor area of the CCD image sensor according to the general frame transfer method shown in FIG. 2.

Accordingly, since the potential under transfer electrode 516 is distributed as shown in FIG. 6, the electrons generated in the $SiO_2/Si$ interface, which cause the dark current, are transferred to p type surface channel region 518 and then, accumulated. The signal charge is transferred to n type buried channel region 513, thereby preventing the electrons generated in the $SiO_2/Si$ interface from mixing into the signal charge of n type buried channel region 513. Thus, the dark current caused by the electrons generated in the $SiO_2/Si$ interface is reduced.

However, the CCD image sensor of the conventional frame transfer method of FIG. 5 has the following two problems. First, since the signal charge generated by the incident light is accumulated in the surface channel layer, if the illuminance exceeds the fixed amount, the dark current overflows the p type surface channel region 518 into the n type buried channel region 513. Thus, there is the problem that the dark current is mixed into the accumulated signal charge.

Further, in the CCD image sensor having the aforementioned structure of the frame transfer method, it is difficult to completely accommodate the electrons generated in the charge transfer interface, i.e., the $SiO_2/Si$ interface in the channel region. In general, it is known that the channel region has a much higher dark current density than the channel stop region.

Accordingly, in order to detect the charge with high sensitivity, a technique in which the dark current of the $SiO_2/Si$ interface is suppressed in the whole CCD image sensor, or a technique in which the electrons generated in the $SiO_2/Si$ interface are completely removed is needed rather than a partial suppression of the dark current according to the aforementioned method.

SUMMARY OF THE INVENTION

The present invention has been made in view of the above circumstances and has as an object to provide a CCD image sensor having high sensitivity with reduced dark current dispersion in each pixel, thereby reducing the micro white defect.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects, and in accordance with the invention as embodied and broadly described herein, the CCD image sensor of this invention comprises a substrate, a buried channel region of a first conductivity type, formed in the substrate to a predetermined depth, for transferring signal charges, a first high concentration impurity region of a second conductivity type, formed in the substrate adjacent to the buried channel region, forming a channel stop, a first surface channel region of the second conductivity type, formed on the buried channel region, for transferring dark current charges, a second high concentration impurity region of the first conductivity type, formed on the first high concentration impurity region, for removing dark current charges from the surface channel region, and a second surface channel region of the second conductivity type formed to a predetermined depth in the substrate between the second high concentration impurity region and the first surface channel region.

To further achieve the objects, and in accordance with the invention as embodied and broadly described herein, the CCD image sensor of this invention comprises a low concentration substrate of a first conductivity type, a low concentration well of a second conductivity type formed on the substrate, a light-detection region for generating signal charges formed in the well, a buried channel region of the first conductivity type formed spaced apart from the light-detection region in the well, a first high concentration impurity region of the second conductivity type, formed on the light-detection region, for reducing dark current, a first surface channel region of the second conductivity type formed on the buried channel region, a second high concentration impurity region of the second conductivity type formed in the well, a third high concentration impurity region of the first conductivity type, formed on the second high concentration impurity region, for sweeping dark current, and a second surface channel region of the second conductivity type formed to a predetermined depth in the well between the third high concentration impurity region and the second surface channel region.

BRIEF DESCRIPTION OF THE ATTACHED DRAWINGS

The accompanying drawings, which are incorporated in and constitute a part of this specification, illustrate embodiments of the invention and, together with the description, serve to explain the objects, advantages, and principles of the invention. In the drawings.

DETAILED DESCRIPTION OF THE INVENTION

Hereinafter, the embodiments of the present invention will be described with reference to the attached drawings.

Figure 1:
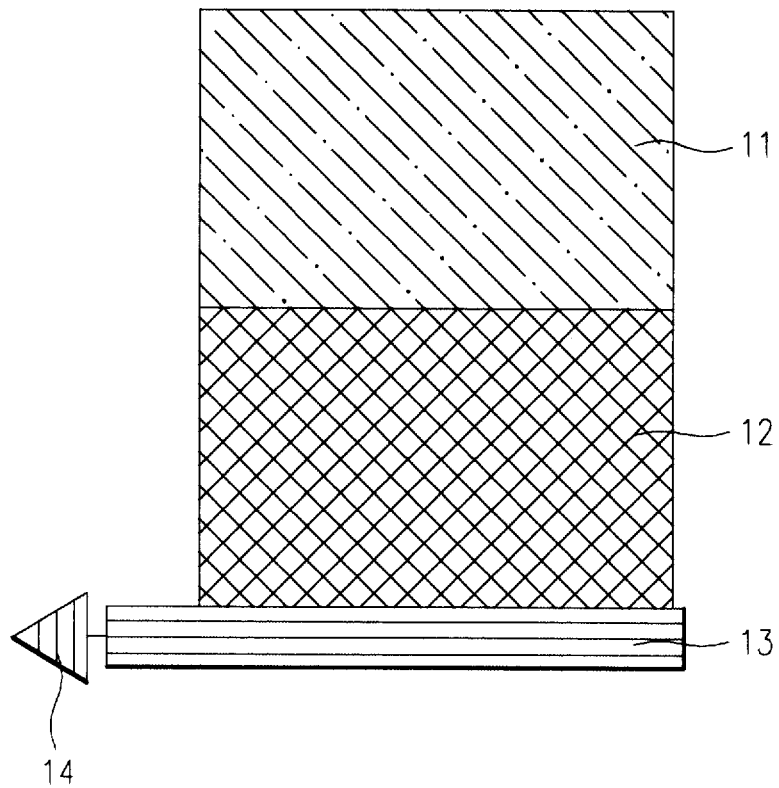
FIG. 1 is a block diagram of a conventional CCD image sensor according to a general frame transfer method.
Figure 2:
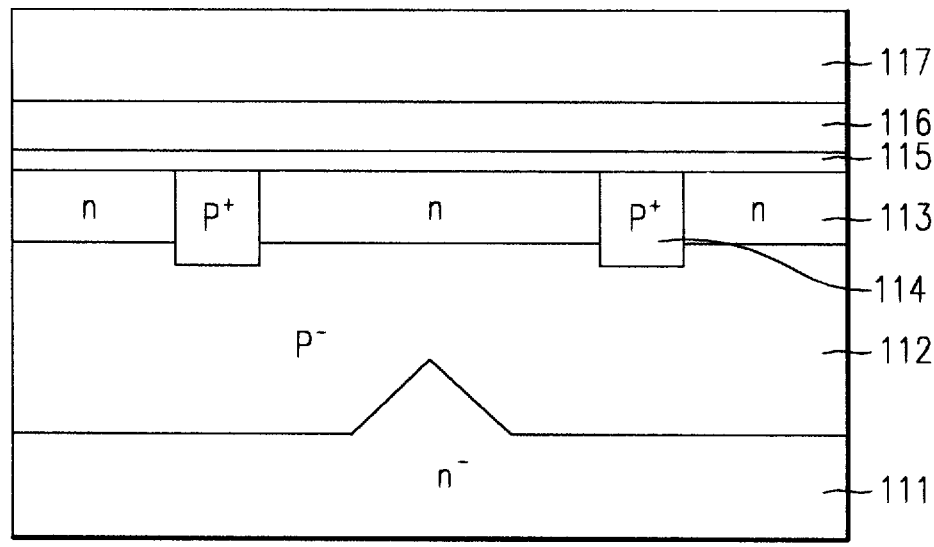
FIG. 2 is a cross-sectional view of a sensor area in the conventional CCD image sensor according to the frame transfer method of FIG. 1.
Figure 3:
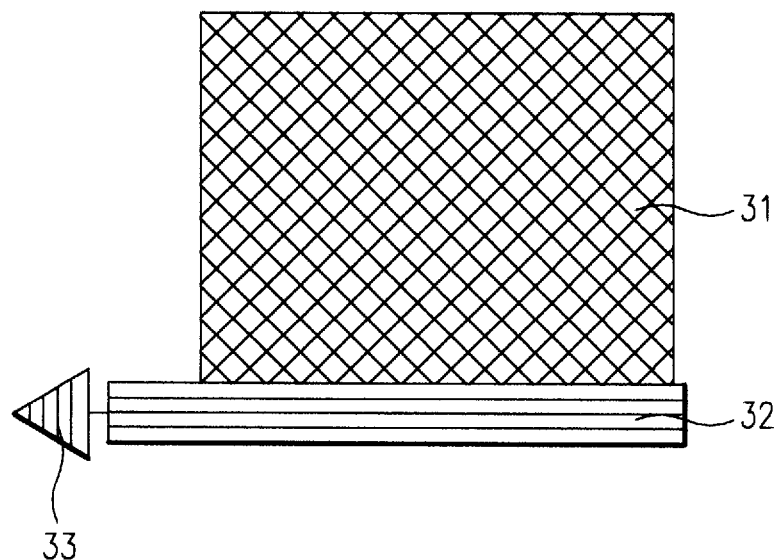
FIG. 3 is a block diagram of a conventional CCD image sensor according to a general interline transfer method.
Figure 4:
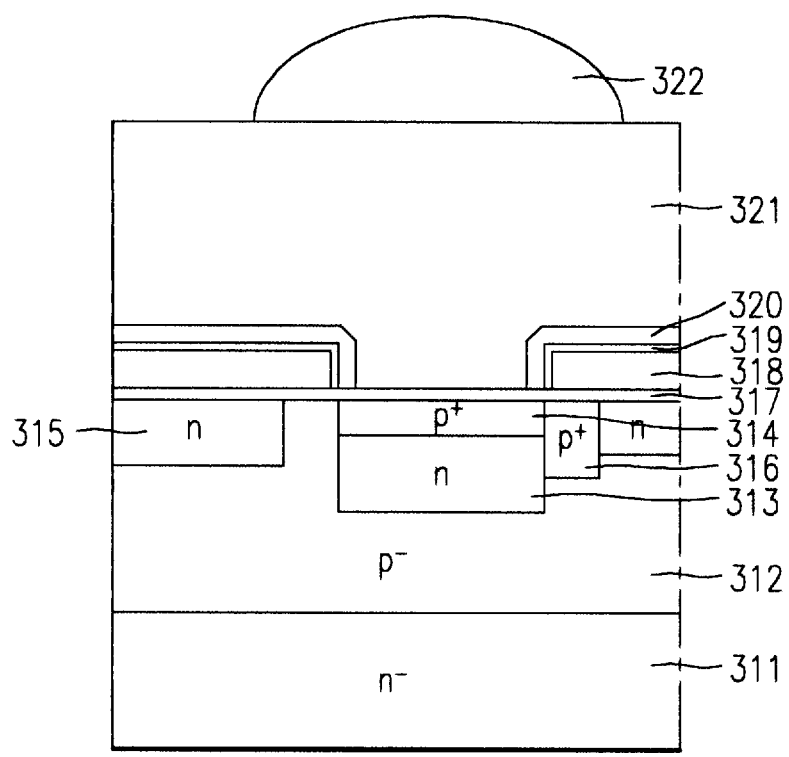
FIG. 4 is a cross-sectional view of a pixel cell in the conventional CCD image sensor according to the interline transfer method of FIG. 3.
Figure 5:
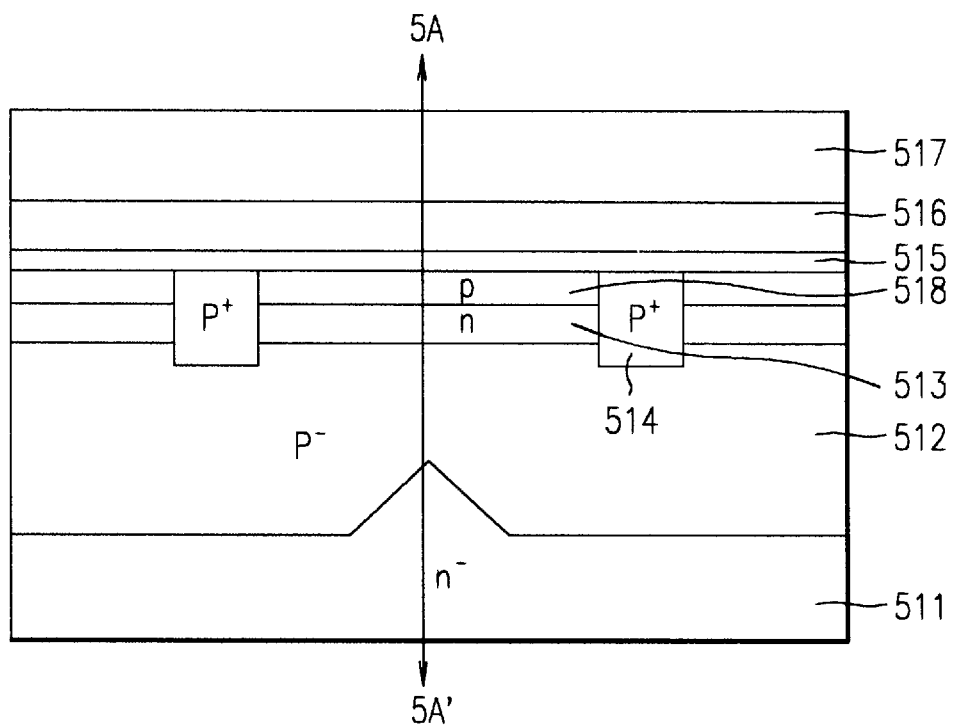
FIG. 5 is a cross-sectional view of a conventional CCD image sensor of the frame transfer method, having the conventional surface channel region.
Figure 6:
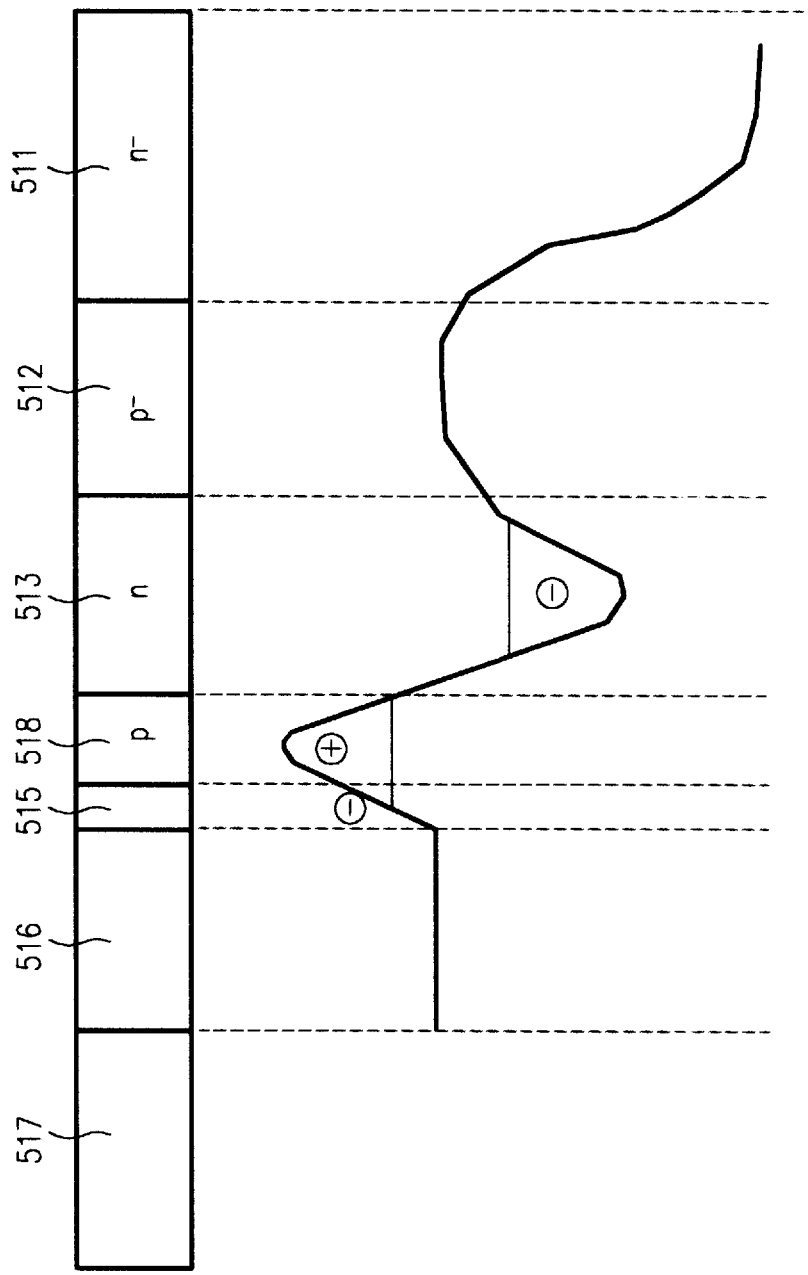
FIG. 6 is a diagram of a potential distribution taken along line 5A–5A' in FIG. 5.
Figure 7:
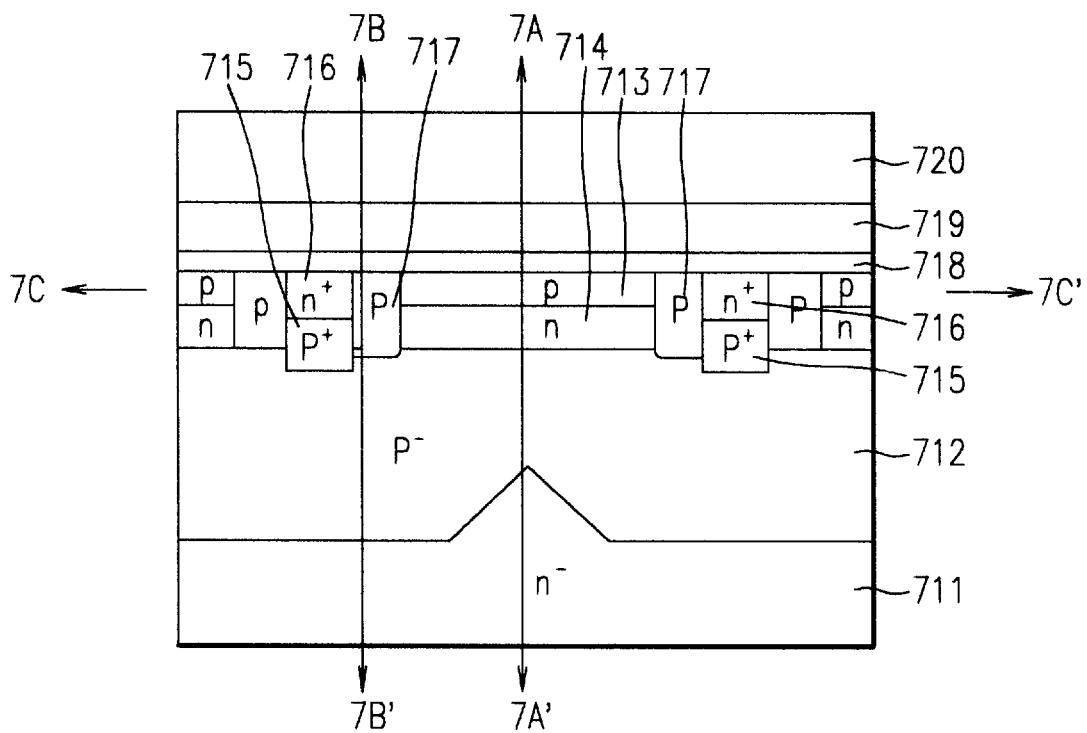
FIG. 7 is a cross-sectional view of a CCD image sensor of the frame transfer method, according to a first embodiment of the present invention.

FIG. 7 is a cross-sectional view showing the structure of the sensor area of a CCD image sensor, according to a first embodiment of the present invention. A $p^-$ type well 712 is formed in an $n^-$ type substrate 711. An n type buried channel region 713 is formed in $p^-$ type well 712 for transferring a signal charge. A $p^+$ type channel stop region 715 is formed in $p^-$ type well 712 adjacent to the n type buried channel region 713. An $SiO_2$ gate insulating film 718, a transfer electrode 719, and an insulating film 720 are formed sequentially on the substrate. In addition, in the sensor area of the CCD image sensor according to the first embodiment, in order to prevent dark current electrons in the interface between n type buried channel region 713 and the gate insulating film 718 from moving to n type buried channel region 713, a first p type surface channel region 714 is formed on n type buried channel region 713. On $p^+$ type channel stop region 715, an $n^+$ type drain region 716 is formed for sweeping the dark current to remove the electrons generated in the interface between the $p^+$ type channel stop region 715 and gate insulating film 718 and a first p type buried channel region 714. In $p^+$ type well 712 between $n^+$ type drain region 716 and first p type surface channel region 714, a second p type surface channel region 717 is formed for sweeping the dark current in order to isolate $n^+$ type drain region 716 for sweeping the dark current from first p type surface channel region 714 and to move the electrons formed in p type surface channel region 714 to $n^+$ type drain region 716.

Figure 8:
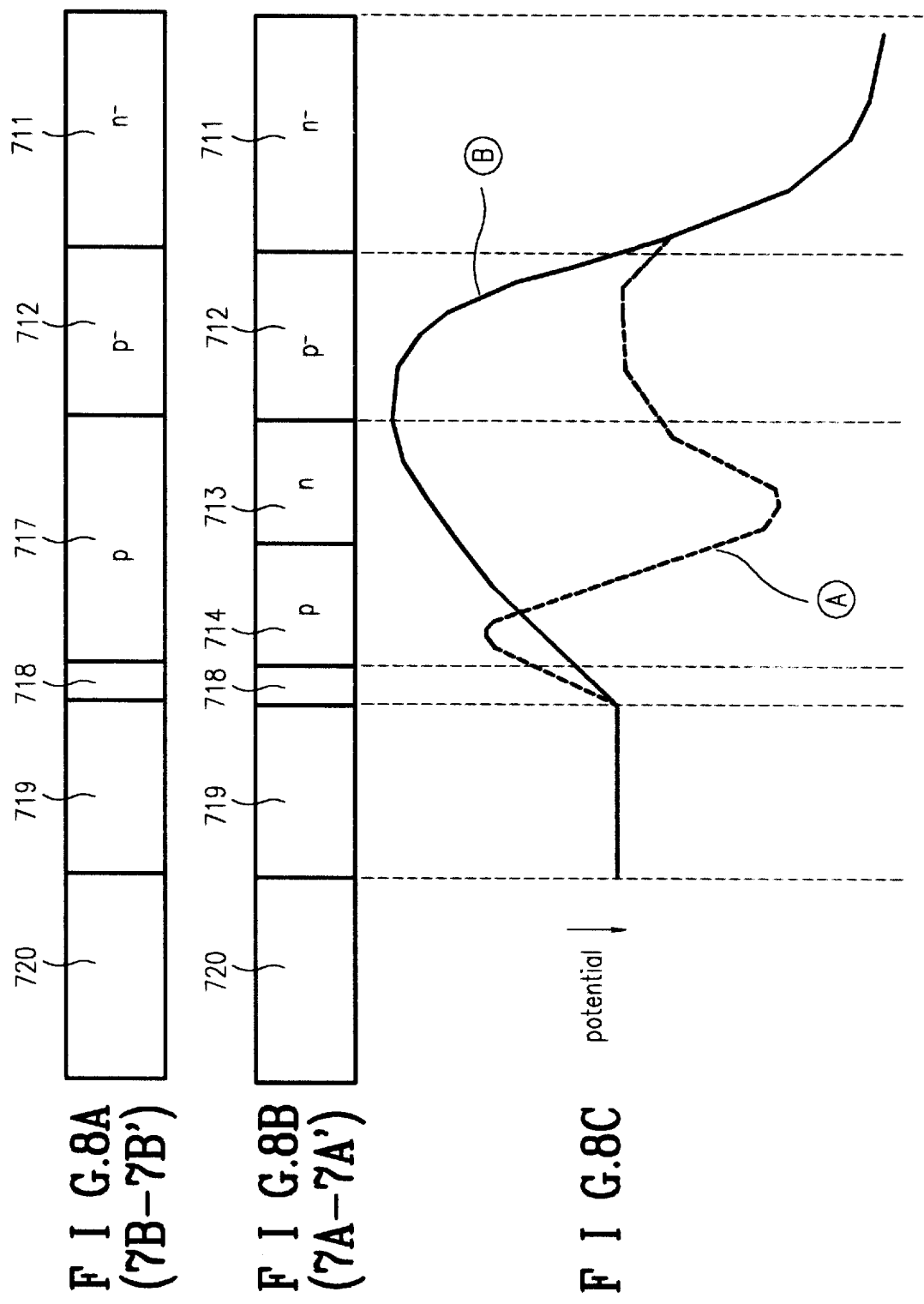
FIGS. 8A and 8B are cross-sectional views of the CCD image sensor of FIG. 7 taken along lines 7A–7A' and 7B–7B'.
FIG. 8C is a diagram of the potential distribution.
Figure 9:
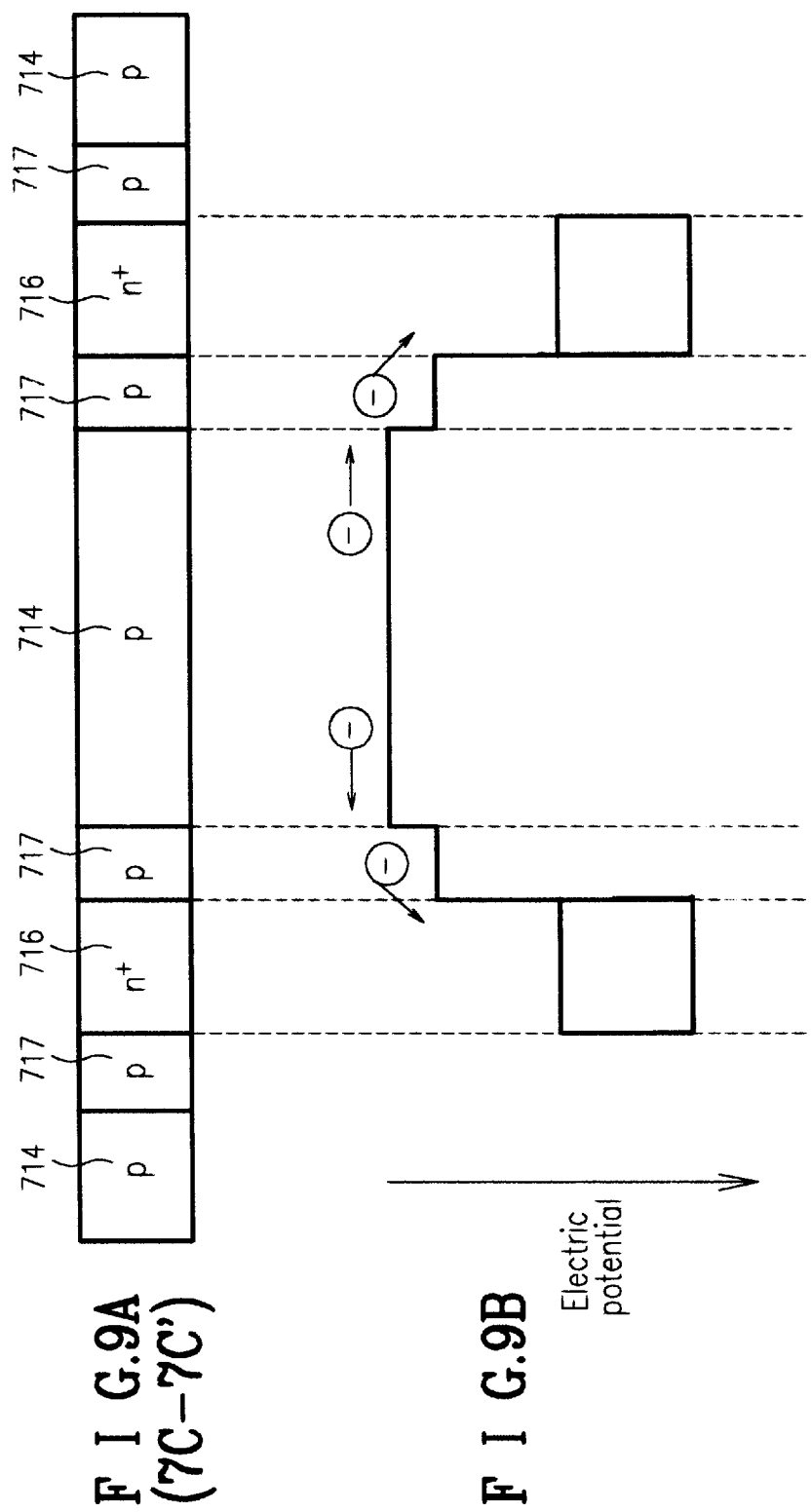
FIG. 9A is a cross-sectional view of the CCD image sensor of FIG. 7 taken along line 7C–7C'.
FIG. 9B is a diagram of the potential distribution.

FIG. 8A is a cross-sectional view taken along lines 7A—7A' in FIG. 7, and FIG. 8B is a cross-sectional view taken along line 7B—7B' in FIG. 7. FIG. 8C is a diagram showing the potential distribution corresponding to each cross-sectional structure. In FIG. 8C, "A" and "B" represent the potential distributions taken along lines 7A—7A' and 7B—7B' of FIG. 7, respectively. FIG. 9A is a cross-sectional view taken along line 7C—7C' of FIG. 7, and FIG. 9B is the potential distribution taken along line 7C—7C' of FIG. 7.

First p type surface channel region 714 formed on n type buried channel region 713 and second p type surface channel region 717 formed between $n^+$ type drain region 716 and p type surface channel region 714 are surface channel regions. However, as shown in FIG. 8C, the potential of the surface channel region taken along line 7A—7A' is higher than that of the surface channel region taken along line 7B—7B'.

Accordingly, the potential of p type surface channel region 717 is lower than that of p type surface channel region 714. Thus, as shown in FIG. 9B, the electrons generated in the interface of $SiO_2/Si$ move to $n^+$ type drain region 716 through p type drain region 717 for sweeping the dark current in the direction of the arrow, and are then removed.

In the CCD image sensor of the frame transfer method according to the present invention, only the sensor area was explained. However, the storage area and HCCD also adopt the above structure.

Therefore, as shown in FIG. 9B, since the entire surface region of the CCD image sensor has the function of sweeping the electrons generated in the $SiO_2$/Si interface, the n type buried channel region 713 for transferring the signal charge is completely isolated from the surface region. Accordingly, the electrons generated in the $SiO_2$/Si interface are not mixed into the signal charge but are removed completely, thereby preventing the generation of dark current.

Further, since the first and second p type surface channel region 714 and $n^+$ type drain region 716 are isolated from n type buried channel region 713, the dark current can be reduced effectively. In addition, since the electrons generated from the GRC in the surface region of the device are removed, the micro white defect which appears on the regeneration picture is remarkably reduced.

As described above, the CCD image sensor according to the first embodiment of FIG. 7 functions such that the entire surface region of the device sweeps the dark current. In addition, the buried channel region 713 is completely isolated from the surface region, thereby reducing the dark current and micro white defect. The above structure can be widely applied to the entire device transferring the signal charge through the buried channel. If the concentration of the p type channel region 716 current is controlled, the drain region 716 can be used with an overflow.

Figure 10:
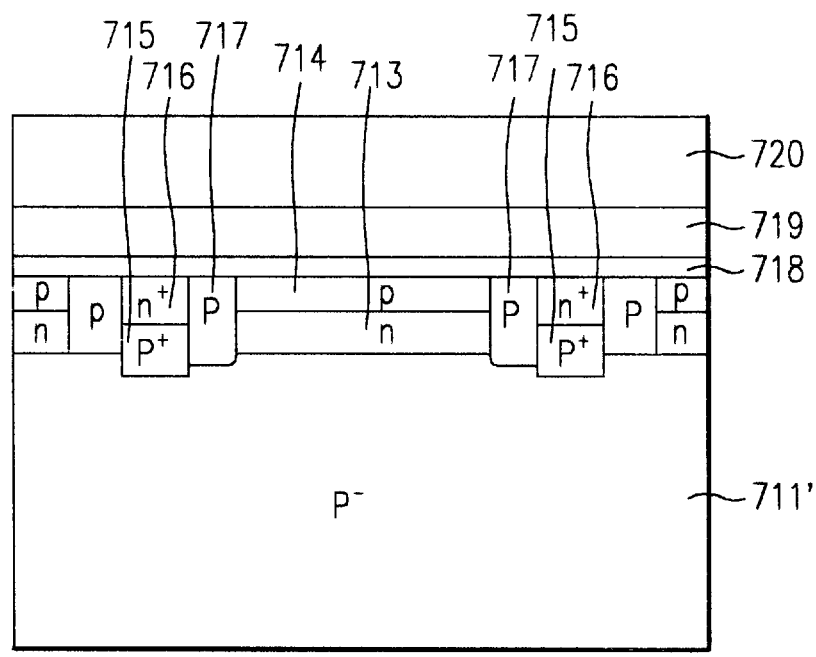
FIGS. 10 to 15 are cross-sectional views of CCD image sensors of the frame transfer method, according to second through seventh embodiments of the present invention.

FIG. 10 is a cross-sectional view showing the structure of the sensor area of a CCD image sensors according to a second embodiment. The CCD image sensor may be directly formed on $p^{31}$ type substrate 711' without $p^-$ type well 712. In such a structure, the charges generated in $p^-$ type substrate 711' are integrated in n type buried channel region 713. Thus, dark current is increased, but sensitivity is improved with respect to long wavelength light (red or infrared).

Figure 11:
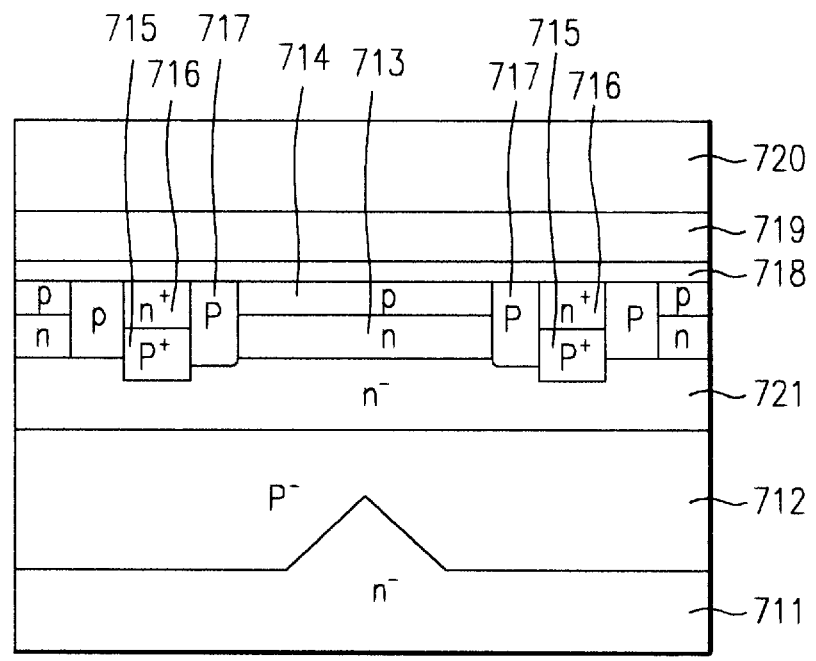

In order to achieve both long wavelength sensitivity improvement and dark current reduction, it is possible to form an $n^-$ type well 721 on $p^-$ type well 712 with a CCD image sensor according to a third embodiment as shown in FIG. 11.

Figure 12:
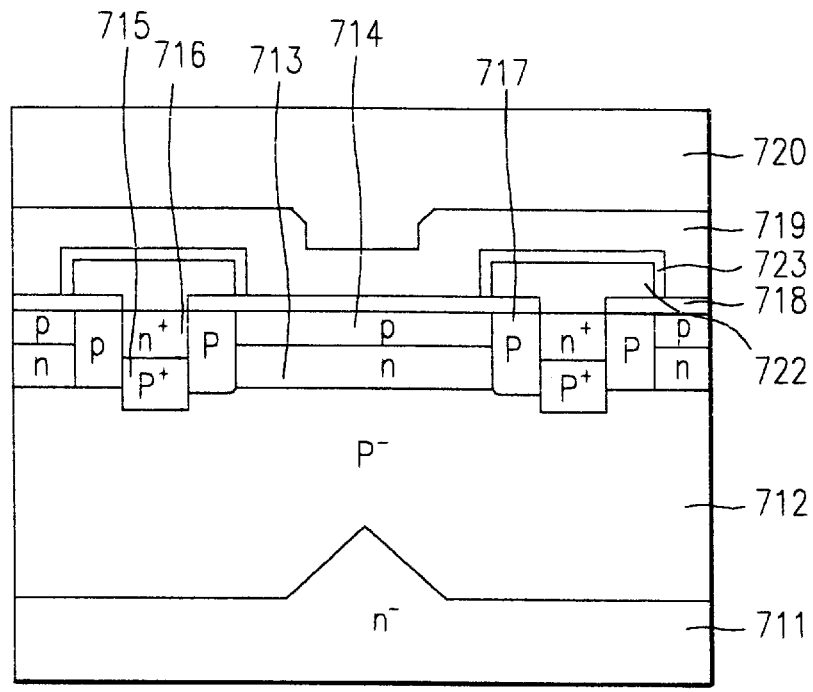

FIG. 12 is a cross-sectional view showing the structure of the sensor area of a CCD image sensor according to a fourth embodiment of the present invention. The CCD image sensor has a similar structure to that shown in FIG. 7 and further comprises a gate 722 formed on the substrate in the upper portion of $n^+$ type drain region 716 for sweeping the dark current. An insulating film 723 is formed on insulating gate 722 for sweeping the dark current from transfer electrode 719.

In case that the above structure is adopted, a wide range of concentrations are available for second p type surface channel region 717. Furthermore, an electron shutter can be realized. That is, a quick response can be obtained with low voltage according to the method where the shutter is turned "ON" by the voltage applied to gate 722, rather than the method where the shutter is turned "ON" by a voltage applied to $n^-$ type substrate 711.

Figure 13:
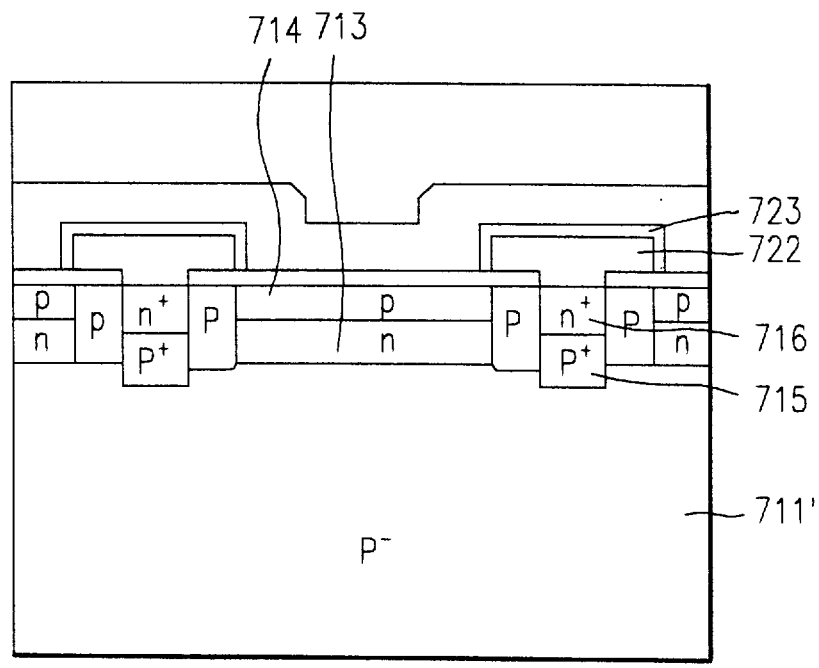

FIG. 13 is a cross-sectional view of the CCD image sensor according to a fifth embodiment of the present invention. Second p type surface channel region 717 functions as the dark sweep drain as well as the over-flow drain, similar to the second embodiment of FIG. 10. Gate 722 for sweeping the dark current is formed on the substrate in the upper portion of $n^+$ type drain region 716.

Figure 14:
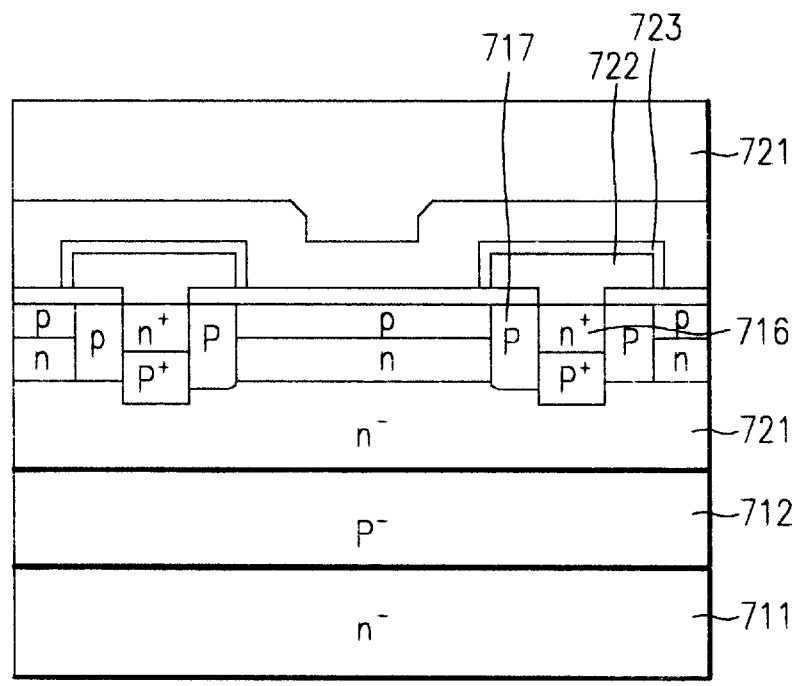

FIG. 14 is a cross-sectional view of a CCD image sensor according to a sixth embodiment of the present invention. The improved long wavelength sensitivity and reduced dark current can both be obtained, as with the third embodiment of FIG. 11. In addition, gate 722 for sweeping the dark current is formed on the substrate in the upper portion of $n^+$ type drain region 716 for sweeping the dark current.

Figure 15:
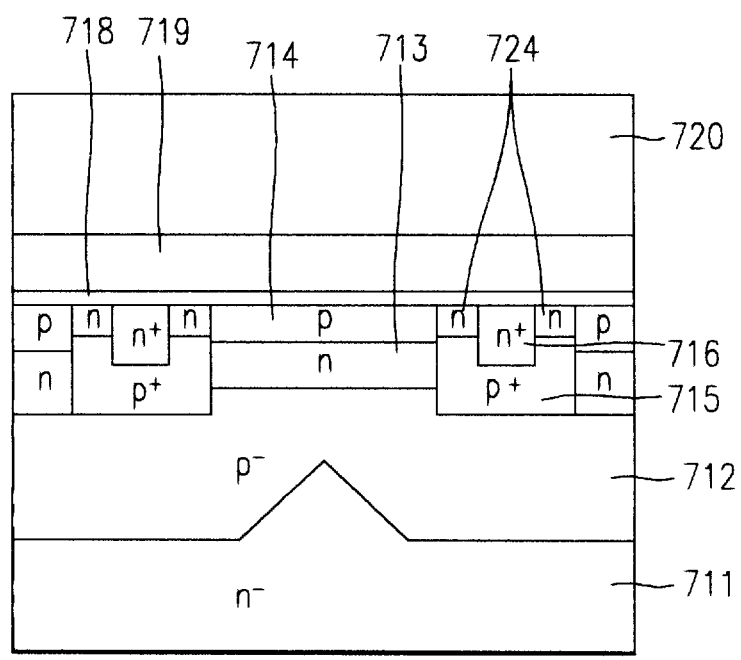

FIG. 15 is a cross-sectional view of the sensor area of a CCD image sensor of the frame transfer method, according to a seventh embodiment of the present invention. This embodiment has a similar structure to that of the first embodiment in which an n type buried channel region 724 is formed instead of the second p type surface channel region 717 as in FIG. 7.

Figure 16:
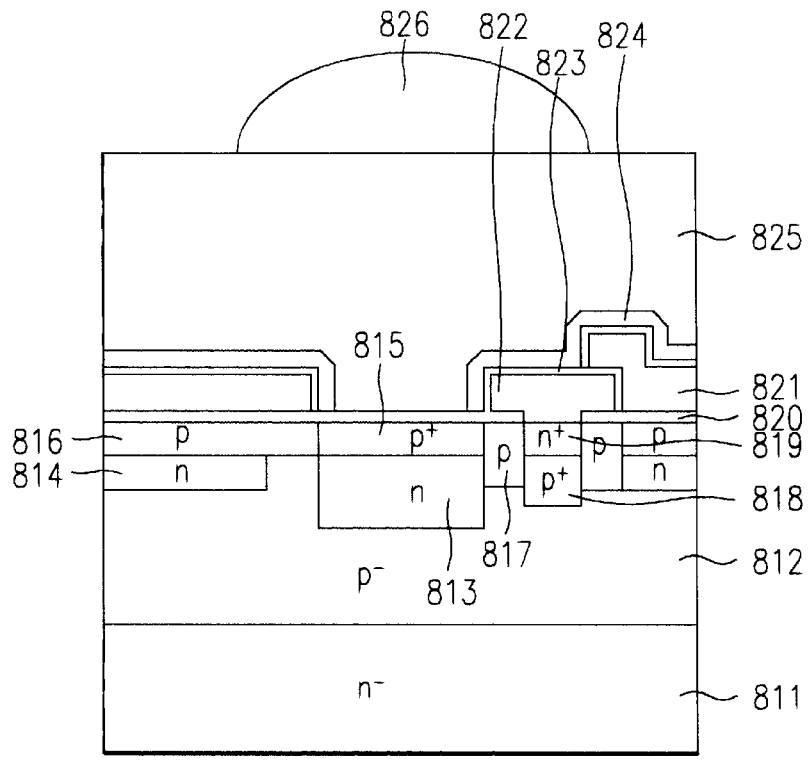
FIGS. 16 and 17 are cross-sectional views of CCD image sensors of the interline transfer method, according to eighth and ninth embodiments of the present invention.

FIG. 16 is a cross-sectional view of a CCD image sensor of the interline transfer method, according to an eighth embodiment of the present invention. A pixel area of the CCD image sensor of the interline transfer method includes a $p^-$ type well 812 formed on an $n^-$ type substrate 811, an n type photodiode region 813 for generating signal charges with respect to the incident light, an n type buried channel region 814 for transferring the signal charges formed spaced apart from n type photodiode region 813 in well 812, a transfer electrode 821 consisting of polysilicon film to which the clock pulse for transferring the signal charge is applied, a light-shielding layer 824 for shielding the light incident upon buried channel region 814, a planarizing layer 825 formed on the entire surface of the substrate, and a microlens 826 located on planarizing layer 825 and over photodiode region 813 and integrating the light incident upon the surface of photodiode region 813. In addition, the pixel further comprises a $p^+$ type hole accumulation layer 815 for reducing the dark current formed on photodiode region 813, a first p type surface channel region 816 formed on n type buried channel region 814, a $p^+$ type channel stop region 818 for isolating devices, an $n^+$ type drain region 819 for sweeping the dark current formed on $p^+$ type channel stop region, a second p type surface channel region 817, a gate 822 for sweeping the dark current formed on $n^+$ type drain region 819, and an insulating film 823 for insulating gate 822, transfer gate 821, and light-shielding film 824 from one another. In the CCD image sensor having the above structure, the dark current is eliminated as with a frame transfer method according to the first embodiment of the present invention.

That is, the dark current generated in n type buried channel region 814 which is the VCCD of the CCD image sensor according to the conventional interline transfer method is removed through first p type surface channel region 816. Furthermore, the dark current generated in $p^+$ type hole accumulation layer 815 on photodiode region 813 is removed through second p type surface channel region 817.

Figure 17:
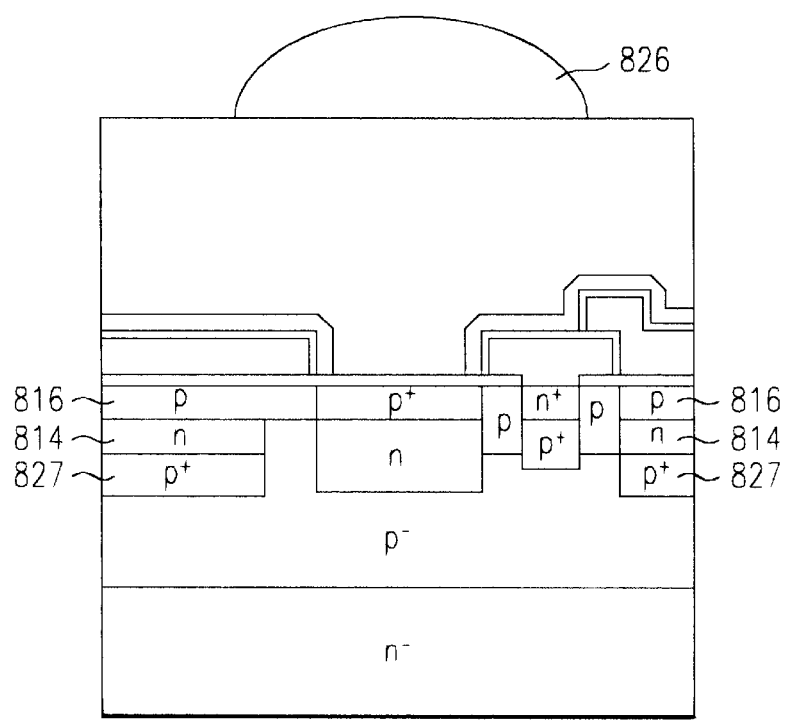

FIG. 17 is a cross-sectional view of the pixel area of a CCD image sensor of the interline transfer method, according to a ninth embodiment of the present invention. This CCD image sensor has a similar structure to that of the CCD image sensor of the eighth embodiment of FIG. 16. This embodiment further comprises a $p^+$ type buried well 827 formed below n type buried channel region 814 for reducing the smear phenomena.

Figure 18:
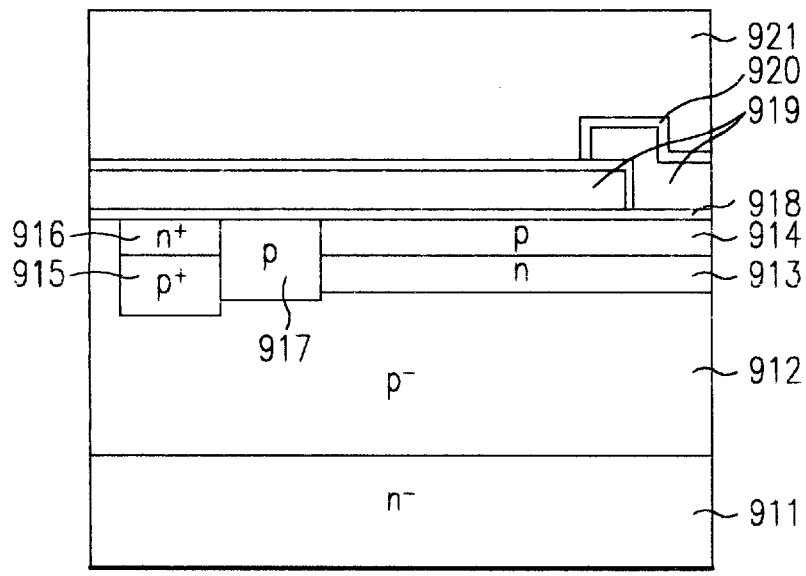
FIGS. 18 and 19 are cross-sectional views of an HCCD applied to the CCD image sensors of the frame transfer method and interline transfer method, according to the present invention.
Figure 19:
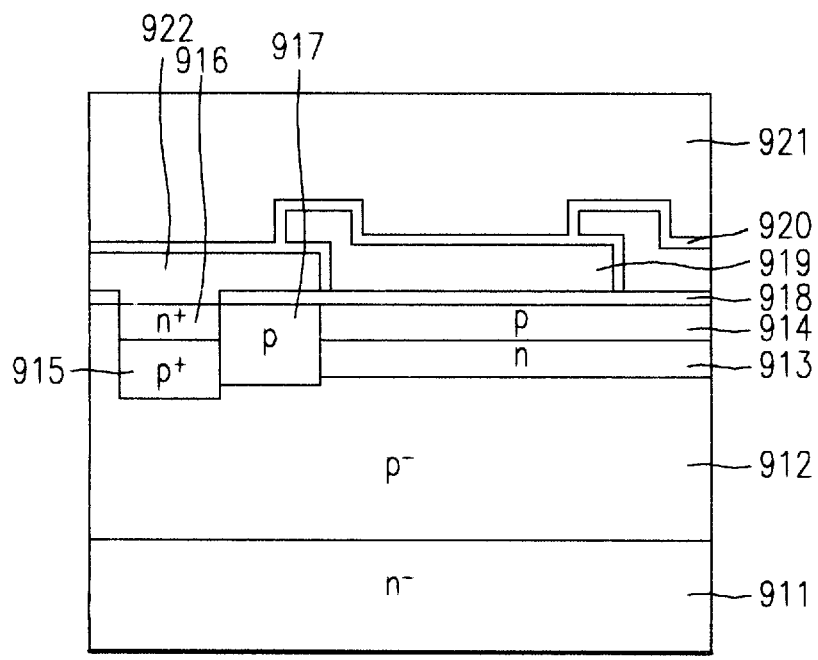

FIGS. 18 and 19 are cross-sectional views showing the HCCD of CCD image sensors of the frame transfer method and of the interline transfer method, according to the present invention. The basic structures of the HCCD of FIGS. 18 and 19 are similar to that of FIG. 7. In the HCCD area, as described above, the electrons generated in the SiO$_2$/Si interface stay in a first p type surface channel region 914. After moving from the interface, the electrons flow to an n$^+$ type drain region 916 through a second p type surface channel region 917.

FIG. 18 shows the CCD image sensor in which a gate for sweeping the dark current is not applied. FIG. 19 shows the CCD image sensor in which a gate 922 is applied for sweeping the dark current.

Figure 20:
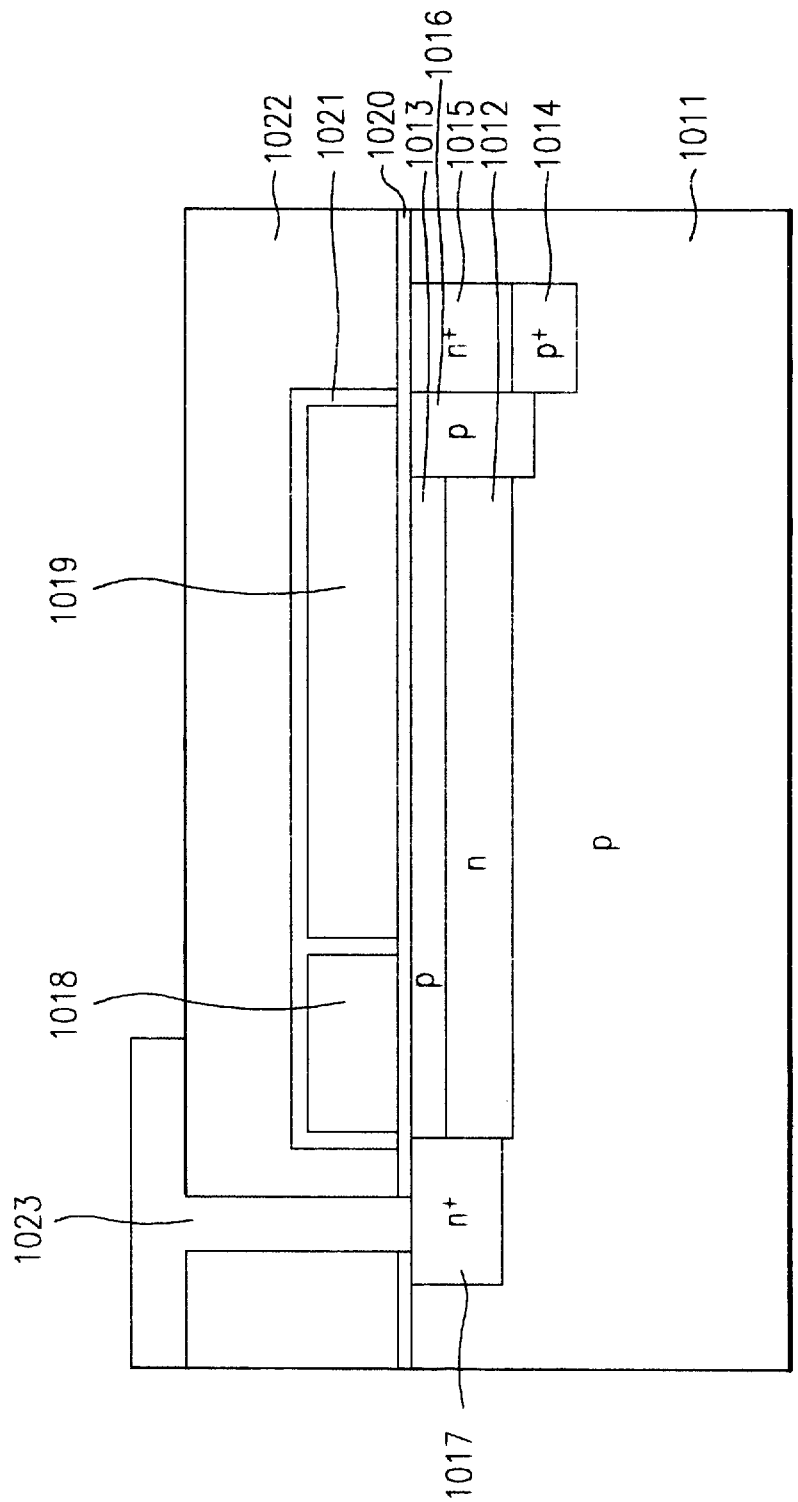
FIG. 20 is a cross-sectional view of a MOS transistor having the CCD structure of the present invention is applied.

According to the present invention as described above, it is possible to apply the structure to almost every type of device using a buried channel. Furthermore, the same effect can be obtained in other devices, such as an MOS transistor. FIG. 20 is a cross-sectional view showing the MOS transistor using the above CCD structure.

In FIG. 20, the MOS transistor comprises a p type substrate 1011, an n type buried channel region 1012, a p type surface channel regions 1013 and 1016, a channel stop region 1014, an n$^+$ type drain region for sweeping the dark current 1015, an n$^+$ type drain region for read-out 1017, a capacitor electrode 1019, a gate for read-out 1018, insulating films 1020, 1021 and 1022, and a read-out line 1023.

In the accumulation state of the MOS transistor of FIG. 20, the surface channel region may apply the voltage to each electrode so that the electrons move from gate 1018 to capacitor electrode 1019. The electrons then pass through a second p type surface channel region 1016, and a gate (not shown) for sweeping the dark current. The charges are accumulated in n type buried channel region 1012 below the capacitor electrode.

In the MOS transistor, n type buried channel region 1012 in which the charges are accumulated is completely isolated from the SiO$_2$/Si interface of the CCD image sensor. Thus, the noise associated with the accumulated charges is reduced, and the period of write conversion is decreased.

According to the present invention as described above, the entire surface region of the device has the function of sweeping electrons generated in the SiO$_2$/Si interface, so that the signal charge transfer region can be completely isolated from the SiO$_2$/Si interface. Therefore, the electrons generated in the SiO$_2$/Si interface are not mixed into the signal charges and removed completely, thereby preventing the generation of the dark current. In addition, the electrons generated from the GRC which exists in the surface region of the device are removed, so that the micro white defect which appears on the regeneration picture is remarkably reduced.

The CCD structure of the present invention can be applied to all devices using a buried channel region for charge transfer, charge accumulation, and incident light detection.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A charge-coupled device image sensor comprising:
   a substrate;
   a buried channel region of a first conductivity type in the substrate having a predetermined depth, the buried channel region transferring signal charges;
   a first surface channel region of a second conductivity type on the buried channel region, the first surface channel region transferring dark current charges;
   a first high concentration impurity region of the first conductivity type spaced from the first surface channel region, the first high concentration impurity region removing dark current charges from the first surface channel region and the first high concentration impurity region having an impurity concentration higher than the buried channel region;
   a second surface channel region of the second conductivity type having a predetermined depth in the substrate between the first surface channel region and the first high concentration impurity region; and
   a second high concentration impurity region of a second conductivity type in the substrate and below the first high concentration impurity region.

2. The charge-coupled device image sensor of claim 1, wherein the substrate comprises a low concentration substrate of the second conductivity type.

3. The charge-coupled device image sensor of claim 1, further comprising a low concentration well of the second conductivity type formed in the substrate.

4. The charge-coupled device image sensor of claim 3, wherein the substrate is a low concentration substrate of the first conductivity type.

5. The charge-coupled device image sensor of claim 4, wherein the buried channel region, the first and second high concentration impurity regions, and the first and second surface channel regions are each formed in the low concentration well.

6. The charge-coupled device image sensor of claim 1, further comprising:
   a first low concentration well of the second conductivity type formed in the substrate; and
   a second low concentration well of the first conductivity type on the first low concentration well of second conductivity type.

7. The charge-coupled device image sensor of the claim 6, wherein the substrate comprises a low concentration substrate of the first conductivity type.

8. The charge-coupled device image sensor of claim 7, wherein the buried channel region, the first and second high concentration impurity regions, and the first and second surface channel regions are each formed in the second low concentration well.

9. The charge-coupled device image sensor of claim 1, further comprising:
   a gate insulating film formed on the substrate;
   a transfer electrode formed on the gate insulating film; and
   a protection layer formed on the transfer electrode.

10. The charge-coupled device image sensor of claim 1, further comprising a gate on the substrate over an upper portion of the first high concentration impurity region.

11. The charge-coupled device image sensor of claim 10, wherein the gate is adapted to sweep dark current charges.

12. The charge-coupled device image sensor of claim 1, wherein a thickness of the buried channel region is less than a thickness of the second surface channel region.

13. A charge-coupled device image sensor comprising:
   a low concentration substrate of a first conductivity type;

a low concentration well of a second conductivity type on the substrate;

a light-detection region of the first conductivity type generating signal charges in the well;

a buried channel region of the first conductivity type spaced apart from the light-detection region in the well;

a first high concentration impurity region of the second conductivity type on the light-detection region reducing dark current charges;

a first surface channel region of the second conductivity type on the buried channel region;

a second high concentration impurity region of the second conductivity type in the well;

a third high concentration impurity region of the first conductivity type on the second high concentration impurity region, the third high concentration impurity region sweeping the dark current charges; and a second surface channel region of the second conductivity type to a predetermined depth in the well between the third concentration impurity region and the first surface channel region.

14. The charge-coupled device image sensor of claim 13, further comprising:

a gate insulating film formed on the substrate;

a transfer electrode formed on the gate insulating film excluding the upper portion of the light-detection region;

an insulating film formed on the transfer electrode;

a light-shielding layer formed on the insulating film and having a window exposing the light-detection region;

a planarizing layer formed on the entire surface of the substrate; and a microlens formed on the planarizing layer above the light-detection region.

15. The charge-coupled device image sensor of claim 13, further comprising a gate for sweeping dark current charges on the substrate over an upper portion of the third high concentration impurity region.

16. The charge-coupled device image sensor of claim 13, further comprising a buried well of the second conductivity type formed below the buried channel region.

17. The charge-coupled device image sensor of claim 16, wherein the buried well is adapted to reduce smear.

18. The charge-coupled device image sensor of claim 13, wherein a thickness of the buried channel region is less than a thickness of the second surface channel region.

19. The charge-coupled device image sensor of claim 13, further comprising a fourth high concentration impurity region of the second conductivity type formed below the buried channel region.

20. A semiconductor device comprising:

a semiconductor substrate of a first conductivity type;

a buried channel region of a second conductivity type in the substrate to a predetermined depth;

a first high concentration impurity region of the second conductivity type spaced apart from the buried channel region;

a first surface channel region of the first conductivity type on the buried channel region;

a second high concentration impurity region of the first conductivity type below the first high concentration impurity region;

a second surface channel region of the first conductivity type between the first high concentration impurity region and the first surface channel region;

a third high concentration impurity region of the second conductivity type adjacent to the first surface channel region opposite the second surface channel region;

a capacitor electrode above the first surface channel region and the second surface channel region; and a read-out gate above the first surface channel region and adjacent to the capacitor electrode.

21. The semiconductor device of claim 20, further comprising a read-out line coupled to said third high concentration impurity region.

* * * * *